US006661354B2

(12) United States Patent
Johnson et al.

(10) Patent No.: US 6,661,354 B2
(45) **Date of Patent: *Dec. 9, 2003**

(54) POTENTIOMETER WITH EMBEDDED SIGNAL CIRCUITRY

(75) Inventors: David B. Johnson, South Ogdon, UT (US); Dean B. Childs, Ogden, UT (US); James A. Elzey, Fruit Heights, UT (US); Timothy A. Tabor, West Jordan, UT (US)

(73) Assignee: Bourns, Inc., Riverside, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/150,571

(22) Filed: May 16, 2002

(65) Prior Publication Data

US 2002/0196162 A1 Dec. 26, 2002

Related U.S. Application Data

(63) Continuation-in-part of application No. 09/567,847, filed on May 9, 2002, now Pat. No. 6,462,677.

(51) Int. Cl.[7] .............................................. H03M 1/22

(52) U.S. Cl. .................. 341/16; 200/11 R; 200/11 DA; 341/10

(58) Field of Search ............................... 341/16, 10, 6, 341/20, 35; 200/11 R, 11 DA

(56) References Cited

U.S. PATENT DOCUMENTS 4,166,200 A 8/1979 Reichen et al.
4,443,670 A 4/1984 Nakamura et al.
4,558,513 A 12/1985 Buss
4,599,605 A 7/1986 Froeb et al.
4,866,219 A 9/1989 Riding et al.
5,017,741 A 5/1991 Brown et al.
5,128,661 A * 7/1992 Fowler ........................ 345/184
5,153,391 A * 10/1992 Dzung et al. ............. 200/11 R
5,430,249 A * 7/1995 Phelps et al. ................. 174/50
5,739,775 A * 4/1998 Brandestini .................. 341/10
5,965,960 A * 10/1999 Cowan et al. .............. 307/125

FOREIGN PATENT DOCUMENTS

WO WO 00/63652 10/2000

OTHER PUBLICATIONS

Vishay Spectrol, "Full 360° Smart Position Sensor" Part No. 601–1045, Document No. 57000, Revised May 10, 2001, www.vishay.com, (pp 156–157).

* cited by examiner

*Primary Examiner*—Brian Young
*Assistant Examiner*—John Nguyen
(74) *Attorney, Agent, or Firm*—Christie, Parker & Hale, LLP

(57) ABSTRACT

A potentiometer and logic circuitry attached to a common substrate. In one aspect the potentiometer and logic circuitry is an integrated potentiometer mounted on an upper surface of a circuit board with circuitry on a lower surface of the circuit board. The circuitry conducts the position and movement of the potentiometer into potentiometer output signals.

25 Claims, 3 Drawing Sheets

POTENTIOMETER WITH EMBEDDED SIGNAL CIRCUITRY

CROSS-REFERENCE TO RELATED APPLICATION(S)

This application is a continuation-in-part of U.S. application Ser. No. 09/567,847, filed May 9, 2000, the disclosure of which is incorporated by reference.

BACKGROUND OF THE INVENTION

The present invention relates to electrical potentiometers that convert angular or linear mechanical movement or position to an electrical output.

Various schemes exist to convert angular or linear mechanical position to an electrical output. An example of such a converter is a potentiometer, which convert position to an output voltage by acting as a resistive divider. The analog output from a potentiometer can then be converted to a digital format, if required.

Potentiometers are well know in the art. An example of a potentiometer is disclosed, for example, in U.S. Pat. No. 4,081,782, the disclosure of which is incorporated by reference. Such devices typically include a housing that encloses a resistive element. A rotor, rotated by a shaft, carries a rotating element that electrically interconnects with the resistive element, such as a film resistor, as the rotor is rotated to generate an electrical signal having a voltage characteristics defined by a point of contact with the resistive element. For example, the rotor may carry a rotating contact element that mechanically contacts the resistive element as the rotor is rotated, to generate the electrical signal.

Some potentiometers convert linear movement into the voltage signal using a slider rather than a rotor, as also understood by those skilled in the art.

SUMMARY OF THE INVENTION

The present invention converts mechanical movement of a device input into a signal that can be applied to particular purposes. In accordance with the present invention, a potentiometer and associated signal conditioning and processing circuitry are embedded together as a single unit for simplicity of assembly into particular applications, and for reliability.

One aspect of the invention provides an electronic device comprising a substrate having opposed first and second major surfaces; a potentiometer coupled to the first major surface of the substrate, the potentiometer having an output terminal on which an electrical signal is produced; and a programmable electronic device coupled to the second major surface of the substrate, the programmable electronic device having an input receiving an indication of the electrical signal.

One aspect of the invention provides an integrated potentiometer comprising a substrate having first and second substantially opposed major surfaces; a potentiometer formed on the first major surface of the substrate, the potentiometer comprising an actuation shaft, the potentiometer varying at least one electrical signal based on movement of the actuation shaft; and programmable electronic circuitry attached to the second major surface of the substrate, the programmable electronic circuitry electrically coupled to the first major surface.

One aspect of the invention provides an integrated potentiometer comprising a substrate having first and second opposed major surfaces; a potentiometer formed on the first major surface of the substrate, wherein the potentiometer is configured to generate an electrical signal in response to movement of an input device; and electronic circuitry attached to the substrate, wherein the electronic circuitry comprises supervisory power processing circuitry, and a logic device for processing the electrical signals generated by the potentiometer, and wherein at least some of the electronic circuitry is attached to the second surface of the substrate.

One aspect of the invention provides an electronic device comprising: a printed circuit board having first and second substantially opposed major surfaces; a potentiometer formed on the first major surface of the substrate, the digital potentiometer comprising: an actuation shaft having rotational and axial movement; at least one resistive element formed on the first major surface of the printed circuit board for converting rotational and axial movement of the actuation shaft into electrical signals; a programmable logic device surface mounted on the second major surface of the printed circuit board, wherein: the programmable logic device is connected through the printed circuit board to the potentiometer to receive the electrical signal generated by the potentiometer; the programmable logic device is programmed to process the electrical signal generated by the digital potentiometer; and supervisory power processing circuitry attached to the second major surface of the printed circuit board for conditioning power applied to the programmable logic device; and a communication interface circuit attached to the second major surface of the printed circuit board for receiving from the programmable logic device processed signals.

These and other aspects of the invention may be more fully comprehended upon review of the following in conjunction with the referenced figures.

DETAILED DESCRIPTION

Figure 1:
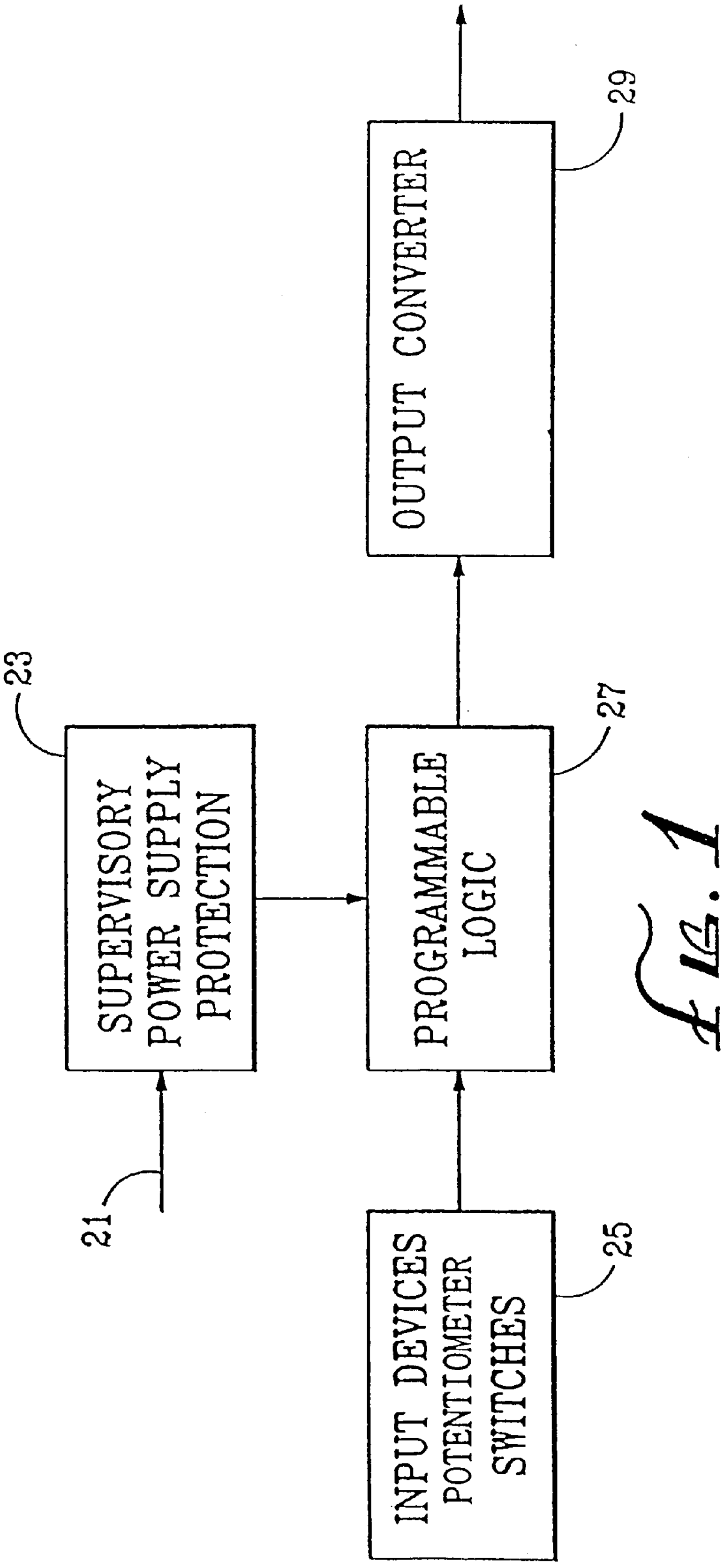
FIG. 1 is a block diagram of a potentiometer with embedded circuitry constructed in accordance with the present invention.

Referring first to FIG. 1, a particular embodiment of the integrated potentiometer device constructed in accordance with the present invention is shown in functional block diagram form. The integrated potentiometer device receives input power through a power input 21 to a supervisory power supply protection component 23. The supervisory power supply protection component 23 may comprise several discrete elements that regulate the power to provide a stable, clean power source; filter the power to remove high frequency noise and protect other elements of the electronic circuitry from voltage spikes; and provide a reset function to ensure proper start-up of the other elements of the circuitry.

An input device 25 provides functional input for the integrated device constructed in accordance with the present invention. In one embodiment the input device is a potentiometer. The potentiometer provides a variable resistence. Accordingly, the potentiometer provides a varying electrical signal, generally a voltage.

Programmable logic 27 receives power from the supervisory power supply protection component 23, and potentiometer signals from the potentiometer input device 25. The programmable logic 27 performs signal conditioning and signal processing functions on the potentiometer signals. The programmable logic is preferably programmable either by the device manufacturer, or by the manufacturer of equipment using the device, to perform functions that are appropriate for the application. The programmable logic may be one-time programmable, or may be repeatedly programmable. The logic may be a programmable microcontroller, such as a RISC-type controller. The programmable logic produces conditioned and processed signals appropriate for use by other, external devices.

An output function converter 29 provides an output interface for making the conditioned and processed signals generated by the programmable logic available for application to other devices.

In accordance with the present invention, a potentiometer that converts linear or rotational mechanical movement into digital electronic signals is formed as an integral unit with circuitry such as programmable logic that performs signal processing and other functions related to the operation of the potentiometer. In one embodiment, the programmable logic 27 is secured to the same electronic board or substrate as the potentiometer 25 itself.

Figure 2:
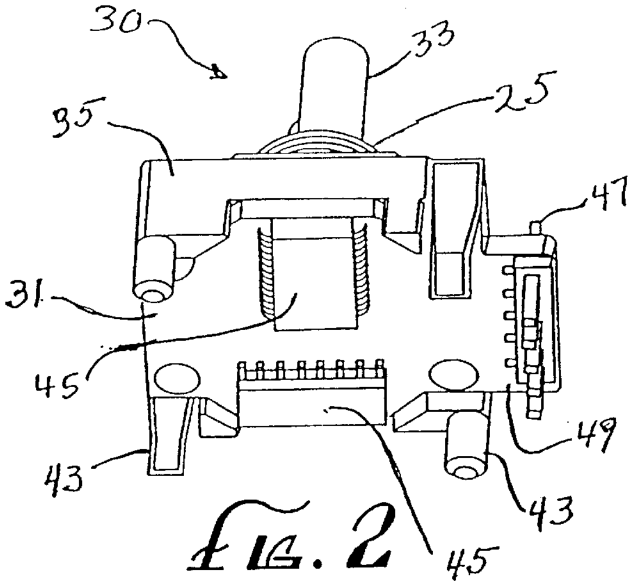
FIG. 2 is a perspective view of the lower side of a potentiometer with embedded circuitry constructed in accordance with the present invention.
Figure 3:
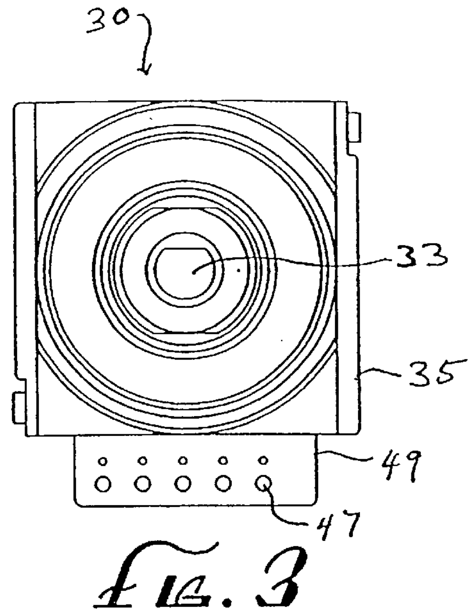
FIG. 3 is a top view of the potentiometer shown in FIG. 2.

A particular embodiment of an integrated potentiometer device 30 constructed in accordance with the present invention is shown in FIGS. 2 through 5. Referring first to FIG. 2 the integrated potentiometer device 30 is seen in a perspective view from its underside. The integrated potentiometer device 30 includes a potentiometer portion 25 mounted on a substrate 31 that comprises a circuit board having upper and lower major surfaces.

The circuit board substrate 31 is formed of conventional circuit board material, such as PCB FR-4, with multiple layers. The circuit board substrate 31 includes circuitry (not shown) on both major surfaces thereof, with the intermediate layer(s) (not shown) containing circuitry interconnecting the surface circuitry as appropriate for particular applications, in a manner known to those skilled in the art.

The upper major surface of the circuit board substrate 31 includes the potentiometer 25, while the lower major surface of the substrate 31 includes circuitry for converting the position and movement of the potentiometer 25 into predetermined electrical signals, generating potentiometer output signals. The circuitry for generating potentiometer output signals may be of substantially conventional design for a potentiometer, which will be familiar to those skilled in the art, and is not here shown in detail. For example, the encoder may be of the type described in the aforementioned U.S. Pat. No. 4,081,782 previously mentioned or other conventional types. In accordance with aspects of some of these conventional designs, a potentiometer includes a rotor with an electrical contact attached to a surface of the rotor. The contact makes electrical contact with a resistive element or elements formed so as to provide a resistance of the device bearing on the position of the rotor. In some embodiments, an actuation shaft is attached to, and extends axially from, the rotor. The actuation shaft permits user input (rotational and axial) to the potentiometer.

Still referring to FIGS. 2–5, a housing 35 encloses the upper potentiometer portion 25 of the integrated potentiometer device 30. The housing 35 includes an upwardly extending hollow cylindrical fitting 37. The actuation shaft 33 of the potentiometer 25 extends through the hollow cylindrical fitting 37. The hollow cylindrical fitting 37 may be externally threaded so that the cylindrical fitting may be attached to a counsel or similar device mounting structure (not shown) that is formed with mating threads. The upper surface of the housing may also include an externally threaded portion 41 to provide an additional option for attaching the integrated potentiometer to a counsel or similar mounting structure.

Figure 4:
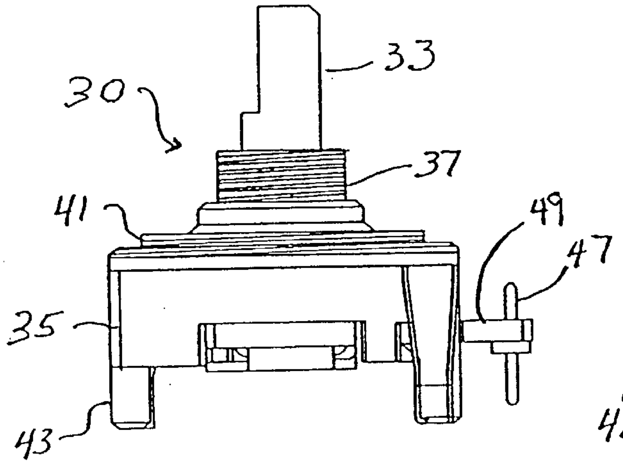
FIG. 4 is a side view of the potentiometer shown in FIG. 2.
Figure 5:
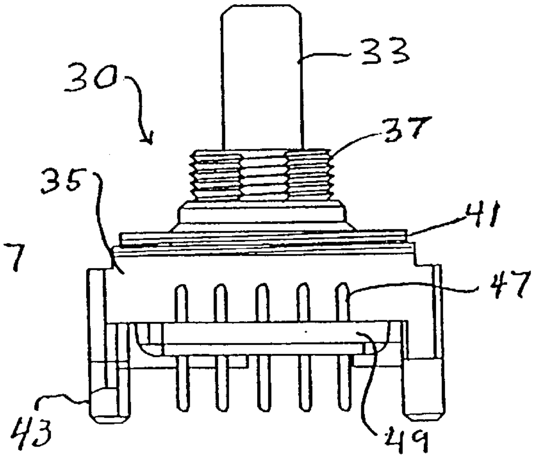
FIG. 5 is a front view of the potentiometer shown in FIG. 2.

Referring now to FIGS. 2, 4, and 5, the lower portion of the housing 35 includes downwardly extending mounting feet 43 that may be used in mounting the integrated potentiometer device 30 in particular applications. For example, the feet 43 may abut a mounting surface (not shown) to position the integrated potentiometer device 30 in its operating environment. In certain embodiments or implementations, openings (not shown) may be provided through the feet 43 to permit mounting screws or other attachment devices (not shown) to be inserted through the housing to secure the integrated potentiometer device 30 to a mounting structure.

Referring again to FIG. 2, one or more circuit elements 45 are mounted on the lower major surface of the substrate 31 (opposite the potentiometer mounting). The circuit elements 45 include the supervisory power supply protection 23, the programmable logic 27, and the output converter 29. Some elements may be mounted on the upper major surface of the substrate, alongside the potentiometer 25. However, in the embodiment illustrated, the upper surface of the substrate encompasses only the potentiometer 25.

The programmable logic 27 may be any of a number of devices of types that are known to those skilled in the art. For example, the programmable logic may include an application specific integrated circuit (ASIC) containing circuitry for processing the signals generated by the encoder. Such circuitry may include circuitry for modifying or conditioning the potentiometer signal, such as signal filters. Such signal filters may include de-bounce circuitry familiar to those skilled in the art. The circuitry of the logic may also include signal modifiers to identify angle of rotation and direction of rotation of the shaft, or to detect the speed with which the potentiometer shaft is manipulated. The circuitry may also provide access to multiple functions in response to particular rotational or axial movement of the shaft. Additional functions may be provided to permit hardware or software keying of functions, to enable or disable embedded features and options. Furthermore, the programmable logic preferably includes memory for programming to accomplish specific tasks desired of the circuitry. The memory may be included on an integrated logic device, or may be a separate device. The memory may be one time programmable, or may be repeatedly programmable. Thus, the memory may include EPROM or EEPROM devices. In a particular preferred embodiment, the logic is provided in a programmable microprocessor, such as a Reduced Instruction Set Controller (RISC-type) microprocessor with embedded memory. Alternatively, programmable logic arrays, and other programmable devices may be included.

Integrated into the programmable logic or microprocessor may be debounce circuitry analogous to the circuitry contained in a conventional MC 14490 device, application-specific decode logic, and other functions that previously performed in discrete separate devices.

The programmable logic 27 may be programmed in such a manner that how the programmable logic interprets signals from the potentiometer 25 can be modified to provide a different output at the output converter 29 (FIG. 1) for a given input supplied by the potentiometer 25. An advantage of the integrated device 30 illustrated and described herein is that the programmable logic can be programmed so that it can be reprogrammed by manipulation of the actuation shaft 33 of the potentiometer 25 itself. For example, the programmable logic can be programmed so that, in certain modes of operation, the signals produced by the potentiometer 25 in response to particular manipulations of the actuation shaft 33 alter features of the programmable logic, such as selecting modes of operation, or adjusting particular performance characteristics of the signal processing functions.

The programmable logic or microprocessor 27 is preferably mounted on the lower major surface of the substrate 31 using surface mount technology. Surface mounting eliminates the protrusion of electrical pins through the substrate. Multilayer substrates with multiple layers of embedded electrical circuitry can be used in combination with such surface mount technology to permit the installation of electric devices on both sides of the substrate board. The circuitry on the lower major surface of the circuit board substrate therefore includes surface mount pads (not shown). Thus, the potentiometer 25 and the programmable logic 27 may be mounted on the opposed major surfaces of a single circuit board substrate 31.

Additional electronic devices 45 may be attached to the lower major surface of the circuit board substrate 31. For example, if the supervisory power supply protection function and the output converter function are not integrated into the programmable logic 27, devices for performing those functions may be separately attached to the lower surface of the circuit board substrate.

The integrated potentiometer device 30 includes a plurality of input and output pins 47. The input and output pins 47 extend vertically from a horizontal extension 49 of one edge of the circuit board substrate 31. In the illustrated embodiment shown in FIGS. 2 through 5, the input and output pins 47 are elongate vertical metal cylinders that provide electrical connections to which a variety of external devices may be attached. Circuitry for conducting power and/or signals between and among the input and output pins 47, the programmable logic 27, the potentiometer 25, and other circuit elements 45 mounted on the circuit board substrate 31 may be applied to either surface major surface of the circuit board substrate, or may be embedded in an intermediate layer of the circuit board substrate. The information of such circuitry on the circuit board substrate will be apparent to those skilled in the art. Those skilled in the art will also recognize that other forms of input and output contact points may be provided on the circuit board substrate.

Potentiometers are used in a variety of applications. One common application is the volume control for an audio device, such as a radio, in which the rotational position of the shaft 33 is converted into a particular volume level. In such an application, an absolute potentiometer may be most appropriate, wherein a particular rotational position of the shaft 33 is always associated with a particular signal, such as to designate a particular volume level. In many such applications, the shaft 33 may also function as the on/off switch for the audio device. For example, briefly depressing the shaft 33 axially turns the audio device on or off. In alternative applications, depressing the shaft 33 of the potentiometer 25 may produce different results in different circumstances. For example, depressing and shortly thereafter releasing the shaft 33 may function as an on/off switch or switch the device between different modes of operation, while holding the shaft in a depressed position for a longer period of time may access a menu of options that may be selected by the user. A single rotary control could therefore provide menu access to multiple functions, eliminating the need for multiple separate controls. For example, a single rotary control on an audio device can be programmed using the present invention to provide controls for treble and bass control, and for balance and fade, as well as power on/off and volume. The functions provided in response to the manipulation of the encoder shaft 33 are determined by the programmable logic included in the integrated potentiometer device 30.

In certain other applications, a relative potentiometer is appropriate. A relative potentiometer generates a signal indicating relative movement of the rotor shaft. Again, the functions provided are determined by the logic included in the integrated potentiometer device 30.

Figure 6:
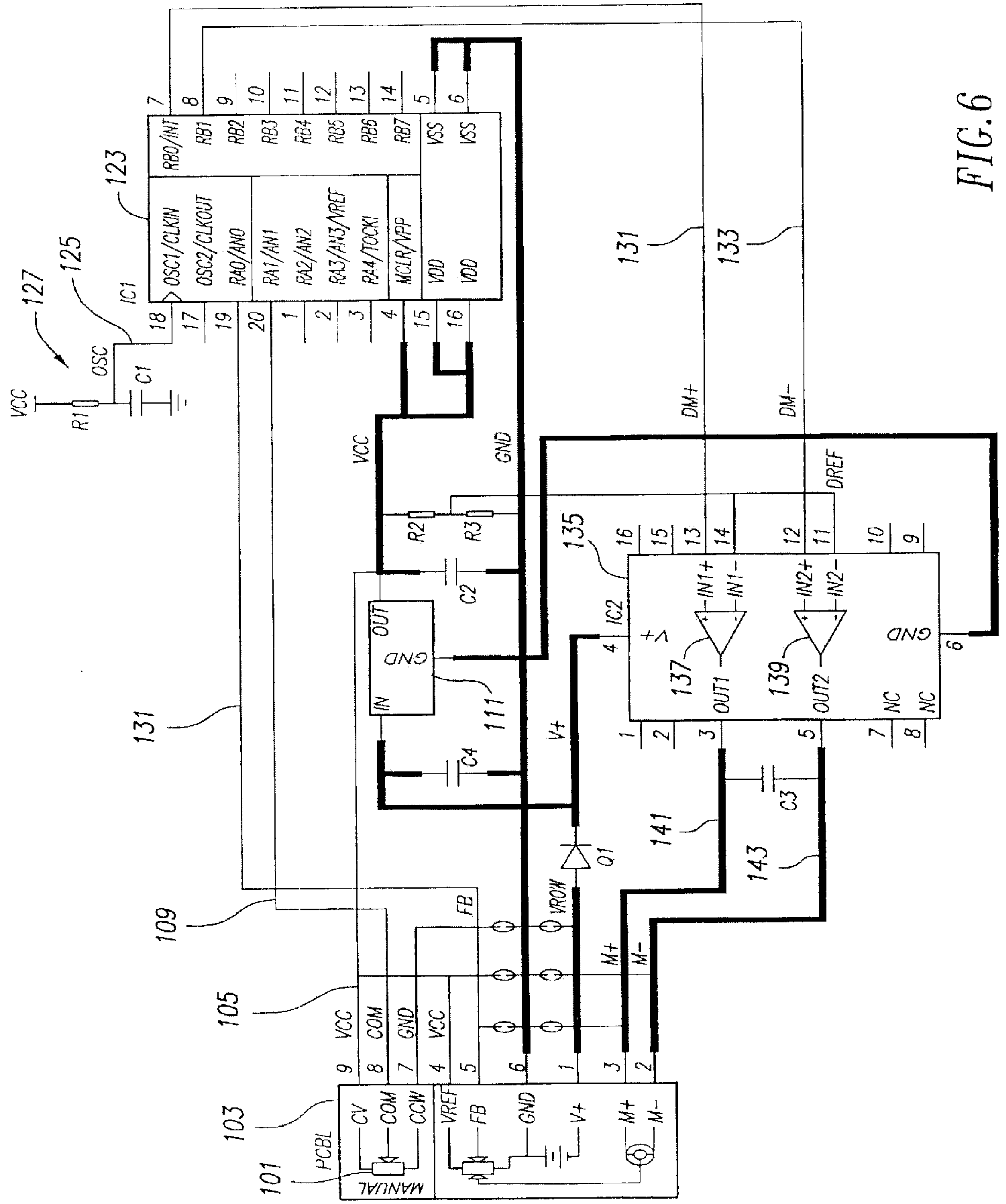
FIG. 6 is a schematic diagram of an electronic device embodying an integrated potentiometer in accordance with the present invention.

An exemplary detailed specific implementation of the integrated potentiometer device 30 of the present invention is illustrated in the circuit diagrams of FIG. 6 for a particular application. In the diagram of FIG. 6, a potentiometer 101 is provided on one surface of a printed circuit board (PCB) 103. The potentiometer is, in some embodiments as previously discussed, and in some embodiments is a surface print potentiometer. The potentiometer receives a high voltage signal and a low voltage signal. In the case of the device of FIG. 6 the high voltage signal is a $V_{CC}$ voltage signal 105 and the low voltage signal is a ground signal 107. The potentiometer provides a common mode signal COM 109. The COM signal indicates a position of, for example, a rotor controlling the variable resistance of the potentiometer.

The $V_{CC}$ and ground signals are provided by a voltage regulator 111. The voltage regulator is mounted to an opposing side of the PCB. The voltage regulator in some embodiments includes a surge protector and other similar power supply related circuitry.

The COM signal of the potentiometer is provided to a processor 123. The processor is also mounted on the opposing side of the PCB. The processor receives power signals from the voltage regulator, and a clock signal 125 provided by an oscillating circuit 127. The processor performs signal processing functions in accordance with the configuration of the processor. In some embodiments the processor is a programmable logic device, an ASIC, a digital signal processor (DSP), a RISC processor, or various other types of processors.

The processor also receives a feedback signal FB 131. The feedback signal is provided to the processor. In various embodiments the processor provides output signals based on the values of the COM and FB signals.

In the embodiment of FIG. 6, the application is a motor controller. Accordingly, the processor also receives a motor indicator signal as the feedback signal. In one embodiment the motor signal indicator is a signal indicating an angular position of a shaft of a motor. Accordingly, operation of the motor results in movement of the shaft coupled to the motor, with the shaft controlling position of a potentiometer. The motor potentiometer provides the feedback signal to the processor.

The processor, in one embodiment, includes analog to digital converter capability and internally generates signals indicative of the voltage, and thus the position, of the potentiometer and the motor potentiometer. In one embodiment, the processor performs a comparison of the two signals, and commands the motor to rotate the shaft. Thus, for example, a processor provides a first output signal 131 and a second output signal 133. The output signals form a differential signal.

The differential signals are provided to a signal driver 135. The signal driver increases the signal strength and otherwise amplifies the signal provided by the microprocessor as necessary to provide drive signals to a motor. In one example, the signal driver is a differential buffer. In one embodiment the signal driver includes a pair of op-amps 137, 139, each op-amp receiving one of the differential signals and a reference signal, with the op-amps providing an open loop gain to drive motor signals 141, 143.

The motor signals are provided to the motor, with the differences in the voltages of the motor signal driving the motor one direction or another. In some embodiments the processor also includes a dead band, in which no motor actuation is provided.

Although the present invention has been described above in particular embodiments, it will be clear from the foregoing discussion that numerous variations and modifications will suggest themselves to those skilled in the pertinent arts. Such variations and modifications should be considered within the spirit and scope of the present invention, defined as the claims and their equivalents supported by this disclosure.

What is claimed is:

1. An electronic device comprising:

a substrate having opposed first and second major surfaces;

a potentiometer coupled to the first major surface of the substrate, the potentiometer having an output terminal on which an electrical signal is produced; and a programmable electronic device coupled to the second major surface of the substrate, the programmable electronic device having an input receiving an indication of the electrical signal.

2. The electronic device of claim 1 wherein the programmable electronic device comprises a signal processor configured for processing using the electrical signal.

3. The electronic device of claim 1 wherein the programmable electronic device comprises a programmable controller.

4. The electronic device of claim 3 wherein the programmable controller is programmed to process using the electrical signal; and the programmable controller is additionally programmed so that the programmable controller can selectively alter processing based on the state of the electrical output.

5. The electronic device of claim 1 further comprising a power regulator coupled to the second major surface of the substrate.

6. The electronic device of claim 5 further comprising a communication interface circuit coupled to the second major surface of the substrate, the communication interface circuit receiving an indication of a processor output signal produced by the programmable electronic device and forming a device output signal.

7. An integrated potentiometer comprising:

a substrate having first and second substantially opposed major surfaces;

a potentiometer formed on the first major surface of the substrate, the potentiometer comprising an actuation shaft, the potentiometer varying at least one electrical signal based on movement of the actuation shaft; and programmable electronic circuitry attached to the second major surface of the substrate, the programmable electronic circuitry electrically coupled to the first major surface.

8. The integrated potentiometer of claim 7, wherein the potentiometer is configured to generate an electrical signal in response to rotational and axial movement of the actuation shaft.

9. The integrated potentiometer of claim 8, wherein the programmable electronic circuitry comprises a signal processor configured for processing the signal produced by the potentiometer.

10. The integrated potentiometer of claim 8, wherein the programmable electronic device comprises a programmable controller.

11. The integrated potentiometer of claim 10, wherein:

the programmable controller is programmed to process the signal produced by the potentiometer; and the programmable controller is additionally programmed so that the electrical signal produced by the potentiometer can selectively alter the signal processing performed by the programmable controller.

12. The integrated potentiometer of claim 8, wherein the electronic circuitry comprises:

a programmable electronic device for performing signal processing functions; and supervisory power circuitry.

13. The integrated potentiometer of claim 12, wherein the electronic circuitry additionally comprises a communication interface circuit.

14. The integrated digital electronic encoder of claim 8, additionally comprising a housing enclosing the potentiometer.

15. The integrated potentiometer of claim 8, wherein the electronic circuitry is surface mounted on the second major surface of the substrate.

16. An integrated potentiometer comprising:

a substrate having first and second opposed major surfaces;

a potentiometer formed on the first major surface of the substrate, wherein the potentiometer is configured to generate an electrical signal in response to movement of an input device; and electronic circuitry attached to the substrate, wherein the electronic circuitry comprises supervisory power processing circuitry, and a logic device for processing the electrical signals generated by the potentiometer, and wherein at least some of the electronic circuitry is attached to the second surface of the substrate.

17. The integrated potentiometer of claim 16, wherein the supervisory power processing circuit comprises a power regulator and a power filter.

18. The integrated potentiometer of claim 17, wherein the power filter comprises a capacitor.

19. The integrated potentiometer of claim 16, wherein the logic device comprises a programmable logic device.

20. The integrated potentiometer of claim 19, wherein the programmable logic device is programmed to perform signal processing functions on the electrical signals generated by the potentiometer.

21. The integrated potentiometer of claim 20, wherein:

the programmable logic device is programmed to process the signal produced by the potentiometer; and the programmable logic device is additionally programmed so that the electrical signal produced by the potentiometer can selectively alter the signal processing performed by the programmable logic device.

22. The integrated potentiometer of claim 21, wherein the electronic circuitry additionally comprises a communication interface circuit.

23. The integrated potentiometer of claim 16, wherein the electronic circuitry is surface mounted on the second major surface of the substrate.

24. An electronic device comprising:

a printed circuit board having first and second substantially opposed major surfaces;

a potentiometer formed on the first major surface of the substrate, the digital potentiometer comprising:

an actuation shaft having rotational and axial movement;

at least one resistive element formed on the first major surface of the printed circuit board for converting rotational and axial movement of the actuation shaft into electrical signals;

a programmable logic device surface mounted on the second major surface of the printed circuit board, wherein:

the programmable logic device is connected through the printed circuit board to the potentiometer to receive the electrical signal generated by the potentiometer;

the programmable logic device is programmed to process the electrical signal generated by the digital potentiometer; and supervisory power processing circuitry attached to the second major surface of the printed circuit board for conditioning power applied to the programmable logic device; and a communication interface circuit attached to the second major surface of the printed circuit board for receiving from the programmable logic device processed signals.

25. The electronic device of claim 24, wherein:

the programmable logic device is programmed to process signals produced by the potentiometer; and the programmable logic device is additionally programmed so that the electrical signals produced by the potentiometer can selectively alter the signal processing performed by the programmable logic device.

* * * * *